US011980032B2

(12) United States Patent
Tang et al.

(10) Patent No.: US 11,980,032 B2
(45) Date of Patent: May 7, 2024

(54) SONOS MEMORY AND METHOD FOR MAKING THE SAME

(71) Applicant: Shanghai Huali Microelectronics Corporation, Shanghai (CN)

(72) Inventors: Xiaoliang Tang, Shanghai (CN); Naoki Tsuji, Shanghai (CN); Haoyu Chen, Shanghai (CN); Hua Shao, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 487 days.

(21) Appl. No.: 17/352,451

(22) Filed: Jun. 21, 2021

(65) Prior Publication Data
US 2022/0020755 A1    Jan. 20, 2022

(30) Foreign Application Priority Data

Jul. 20, 2020   (CN) .......................... 202010698851.3

(51) Int. Cl.
*H10B 43/35*    (2023.01)
(52) U.S. Cl.
CPC .................... *H10B 43/35* (2023.02)
(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS

| 6,656,794 B2 * | 12/2003 | Shibata | H10B 43/30 257/E21.59 |
| 6,787,417 B2 * | 9/2004 | Inoue | H10B 99/00 438/258 |

(Continued)

FOREIGN PATENT DOCUMENTS

| CN | 101369582 A | 2/2009 |
| CN | 106057812 A | 10/2016 |
| CN | 110854119 A | 2/2020 |

OTHER PUBLICATIONS

Dec. 27, 2021—(CN) Search Report Appn 202010698851.3.

*Primary Examiner* — Didarul A Mazumder
*Assistant Examiner* — Gustavo G Ramallo
(74) *Attorney, Agent, or Firm* — Banner & Witcoff, Ltd.

(57) ABSTRACT

The present application discloses a method for manufacturing a SONOS memory, including: providing a substrate, wherein a first transistor gate of the SONOS memory and a first layer used for forming a second transistor gate are formed on the substrate; forming a patterned second layer on the upper surface of the first layer, wherein the second layer exposes the first layer corresponding to the outer side of the second transistor gate; performing first etching on the first layer exposed by the second layer; removing the second layer; and performing second etching on the first layer to form the second transistor gate. The present application also discloses a SONOS memory. The present application can form a vertical structure outside a selective transistor and a storage transistor, thus forming a vertical side wall in the subsequent process, so as to improve the performance of the device.

11 Claims, 8 Drawing Sheets

(58) Field of Classification Search
CPC ........ H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | |
|---|---|---|---|
| 6,838,344 B2* | 1/2005 | Satoh | H10B 43/30 |
| | | | 438/257 |
| 2003/0122185 A1* | 7/2003 | Wang | H01L 29/42324 |
| | | | 257/E27.103 |
| 2005/0142758 A1* | 6/2005 | Jung | H01L 29/42324 |
| | | | 438/258 |
| 2006/0046390 A1 | 3/2006 | Shih et al. | |
| 2006/0234454 A1* | 10/2006 | Yasui | H10B 43/30 |
| | | | 257/E21.21 |
| 2007/0161195 A1 | 7/2007 | Lee et al. | |
| 2007/0284620 A1* | 12/2007 | Lue | G11C 16/0466 |
| | | | 257/213 |
| 2017/0084622 A1* | 3/2017 | Hsu | H10B 41/41 |
| 2021/0143259 A1* | 5/2021 | Tang | H01L 29/40117 |

\* cited by examiner

| A substrate is provided, wherein a first transistor gate of the SONOS memory and a first layer used for forming a second transistor gate are formed on the substrate, and the first layer covers the first transistor gate and the substrate; | — S100 |

| A patterned second layer is formed on the upper surface of the first layer, wherein the second layer exposes the first layer corresponding to the outer side of the second transistor gate; | — S200 |

| First etching is performed on the first layer exposed by the second layer; | — S300 |

| The second layer is removed to re-expose the first layer; | — S400 |

| Second etching is performed on the first layer to form the second transistor gate. | — S500 |

FIG 4

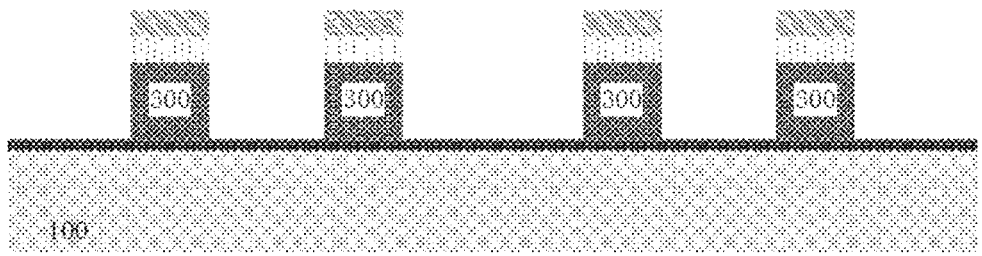

FIG 5A

SONOS MEMORY AND METHOD FOR MAKING THE SAME

CROSS-REFERENCES TO RELATED APPLICATIONS

This application claims priority to Chinese patent application No. 202010698851.3 filed on Jul. 20, 2020, and entitled "SONOS MEMORY AND METHOD FOR MAKING THE SAME", the disclosure of which is incorporated herein by reference in its entirety.

TECHNICAL FIELD

The present application relates to the field of semiconductor devices and manufacturing thereof, in particular to a SONOS memory and a manufacturing method thereof.

BACKGROUND

Since the early day when Dr. Jack Kilby of Texas Instruments invented the integrated circuit, scientists and engineers have made numerous inventions and improvements in the aspects of semiconductor device and process. The size of semiconductors has been significantly reduced in the past 50 years, leading to a continuous increase in the processing speed and a continuous reduction in the power consumption. So far, the development of semiconductors generally follows the Moore's Law. The Moore's Law generally indicates that the number of transistors in a dense integrated circuit doubles approximately every two years. Currently, the semiconductor process is developing towards a node below 20 nm, and some companies are working on the 14-nm process. A reference is provided herein, wherein the diameter of a silicon atom is about 0.2 nm, which means that the distance between two independent components manufactured by means of the 20-nm process is only about the sum of the diameters of a hundred silicon atoms.

Therefore, the manufacturing of semiconductor devices becomes increasingly challenging and develops towards the feasible physical limit. One of the recent developments in the semiconductor technology is the use of silicon germanium (SiGe) in semiconductor manufacturing. In the evolution of integrated circuit development, as the geometric size (i.e., the smallest component or line that can be produced in a process) decreases, the functional density (such as the number of interconnection components per chip area) generally increases. Such the size reduction process usually can increase the productive efficiency and reduce related costs to provide benefits. However, how to design a reasonable transistor structure to reduce the size thereof is challenging.

Currently, in an integrated circuit, a minimum memory cell generally includes a storage transistor and a selective transistor matching the storage transistor. The storage transistor has a Silicon (gate)-Oxide-Nitride-Oxide-Silicon (substrate) (SONOS) structure, and the selective transistor is a conventional MOS transistor. In order to reduce the area of the memory cell, a 1.5 T (transistor) SONOS memory cell structure is proposed, which also includes two independently operable transistors, but the two transistors are arranged close to each other, as shown in FIG. 1. The selective transistor 300 is mainly used for turning on and off the storage transistor 400, so as to reduce electric leakage. The storage transistor 400 is mainly used for storing electric charges, so as to implement data storage by means of different Vt states.

FIGS. 2A-2F illustrate schematic structural diagrams in a process of manufacturing a 1.5 T SONOS memory according to an existing process for manufacturing a 1.5 T SONOS memory. Referring to FIG. 2A, first, a selective transistor gate 300 needs to be formed by etching, and then an ONO storage layer 200 (including an oxide 201, a nitride 202, and an oxide 203) and a polysilicon layer 401 for forming a storage transistor gate are deposited, as shown in FIG. 2B. Subsequently, referring to FIG. 2C, the redundant polysilicon layer needs to be removed by etching, so that a storage transistor gate 400' structure is naturally formed next to a selective transistor gate structure, and the ONO layer deposited as shown in FIG. 2B is used as an isolation layer. Then, referring to FIG. 2D, an area between adjacent memory cells is opened by means of photolithography (i.e., by forming a patterned photoresist 600). Referring to FIG. 2E, the redundant polysilicon between the selective transistor gates of adjacent memory cells are removed by etching, and then the photoresist is removed, as shown in FIG. 2F. Currently, such the structure is used by the industrial mainstream, wherein by depositing different interlayer dielectric layers, the structures of selective transistor and storage transistor can be interchanged via the same technological process.

In the existing 1.5 T SONOS memory manufacturing process as provided in FIGS. 2A-2F, the etching process of the storage transistor gate is a key process. The difficulty of the process lies in how to form an edge structure as vertical as possible to provide a foundation for forming an effective sidewall on the outer side of the storage transistor gate in a subsequent process. FIG. 3 illustrates a 1.5 T SONOS memory structure formed according to the existing 1.5 T SONOS memory manufacturing process as provided in FIGS. 2A-2F. It can be seen from FIG. 3 that no vertical structure is formed on the outer side of the storage transistor gate 400', and therefore, no effective sidewall can be formed in the subsequent process. It can be seen that, compared with a sidewall 503 on the outer side of the selective transistor gate 300 having a vertical structure, a sidewall 504' on the outer side of the storage transistor gate 400' having no vertical structure is significantly smaller than the sidewall 503 on the outer side of the selective transistor gate 300. Moreover, a relatively small sidewall structure is inconducive to the isolation of device gates, inconducive to the prevention of crosstalk between device gates, and inconducive to the improvement of memory cell performance.

Therefore, there is an urgent need for a novel method for manufacturing a 1.5 T SONOS memory, whereby the current 1.5 T SONOS memory manufacturing process can be improved to effectively overcome the problem of no vertical structure formed on the side of the storage transistor gate in the existing process and to form a vertical gate side structure via a simple process, so that an etching process for etching the storage transistor gate is easier to be controlled, thereby facilitating the improvement of memory cell performance and increasing a process control window.

BRIEF SUMMARY

A brief overview of one or more aspects is provided below to provide a basic understanding of these aspects. The overview is not a detailed and comprehensive overview of all the conceived aspects, and is neither intended to identify the key or decisive elements of all the aspects, nor is it attempt to define the scope of any or all of the aspects. The sole purpose is to present some concepts of one or more aspects in a simplified form as a prelude to the more detailed description provided subsequently.

As described above, no vertical structure is formed on the outer side of a storage transistor gate in the existing 1.5 T SONOS memory manufacturing process, and therefore, no effective sidewall can be formed subsequently, resulting in degradation of the performance of the 1.5 T SONOS memory. In order to solve the problem described above, one aspect of the present application provides a method for manufacturing a SONOS memory, specifically comprising steps of:

providing a substrate, wherein a first transistor gate of the SONOS memory and a first layer used for forming a second transistor gate are formed on the substrate, and the first layer covers the first transistor gate and the substrate;

forming a patterned second layer on the upper surface of the first layer, wherein the second layer exposes the first layer corresponding to the outer side of the second transistor gate;

performing first etching on the first layer exposed by the second layer;

removing the second layer to re-expose the first layer; and performing second etching on the first layer to form the second transistor gate.

In the method for manufacturing a 1.5 T SONOS memory provided by the present application, the verticality of the edge of a storage transistor gate can be effectively improved by etching polysilicon that forms the storage transistor twice, providing the possibility for subsequently forming an effective sidewall on the outer side of the storage transistor gate, and thereby effectively improving the device performance.

In an embodiment of the manufacturing method, optionally, forming the second layer comprises steps of:

forming a barrier layer on the upper surface of the first layer corresponding to the outer side of the second transistor gate;

forming the second layer on the upper surface of the first layer where the barrier layer is not formed; and removing the barrier layer.

In an embodiment of the manufacturing method, optionally, forming the barrier layer comprises steps of:

forming a third layer covering the first layer; and etching the third layer, and retaining the third layer corresponding to the outer side of the second transistor gate as the barrier layer.

In an embodiment of the manufacturing method, optionally, the barrier layer is silicon nitride, the first layer is polysilicon, and the forming the second layer on the upper surface of the first layer where the barrier layer is not formed comprises:

performing, by using the barrier layer as a barrier, oxidation on an area of the first layer where the barrier layer is not formed, to form the second layer made of silicon oxide.

In an embodiment of the manufacturing method, optionally, removing the barrier layer comprises:

removing the barrier layer by using a reagent with a high selection ratio in a wet manner.

In an embodiment of the manufacturing method, optionally, performing the first etching on the first layer exposed by the second layer comprises:

completely etching the first layer exposed by the second layer, to form the vertical outer side of the second transistor gate.

In an embodiment of the manufacturing method, optionally, performing the first etching on the first layer exposed by the second layer comprises:

partially etching the first layer exposed by the second layer, to define the vertical outer side of the second transistor gate; and performing the second etching on the first layer comprises:

etching the first layer that is not etched in the first etching and is exposed by the second layer, to form the vertical outer side of the second transistor gate.

In an embodiment of the manufacturing method, optionally, an isolation layer is formed between the first transistor gate and the first layer, and the formed second transistor gate is adjacent to the first transistor gate via the isolation layer.

In an embodiment of the manufacturing method, optionally, first transistor gates of a plurality of SONOS memories are formed on the substrate, the first layer covers a plurality of first transistor gates, and the second layer exposes the first layer corresponding to the outer sides of a plurality of second transistor gates; and wherein performing the first etching and the second etching on the first layer comprises:

synchronously forming the plurality of second transistor gates.

In an embodiment of the manufacturing method, optionally, the first transistor gates and the second transistor gates of two adjacent SONOS memories are arranged symmetrically.

In an embodiment of the manufacturing method, optionally, the manufacturing method further comprises:

forming a sidewall on the outer sides of the first transistor gate and the second transistor gate.

In an embodiment of the manufacturing method, optionally, the first transistor is a storage transistor, and the second transistor is a selective transistor; or the first transistor is a selective transistor, and the second transistor is a storage transistor.

Another aspect of the present application provides a SONOS memory, wherein the SONOS memory is formed according to any one of the embodiments of the manufacturing method described above.

According to the method for manufacturing a SONOS memory provided in one aspect of the present application, the current 1.5 T SONOS memory manufacturing process can be improved to effectively overcome the problem of no vertical structure formed on the side of the storage transistor gate in the existing process and to form a vertical gate side structure via a simple process, so that an etching process for etching the storage transistor gate is easier to be controlled, thereby facilitating the improvement of memory cell performance and increasing a process control window. The verticality of the side of the storage transistor gate of the SONOS memory provided in another aspect of the present application is better, so that the device performance is more stable.

BRIEF DESCRIPTION OF THE DRAWINGS

By reading the detailed description of the embodiments of the present disclosure with reference to the following drawings, one can better understand the above-mentioned features and advantages of the present application. In the drawings, various components are not necessarily drawn to scale, and components with similar related characteristics or features may have the same or similar reference numerals.

FIG. 4 illustrates a schematic flowchart of a method for manufacturing a SONOS memory provided in one aspect of the present application.

FIGS. 5A-5H illustrate schematic structural diagrams in a process of manufacturing a 1.5 T SONOS memory according to the method for manufacturing a SONOS memory provided in one aspect of the present application.

REFERENCE NUMERALS

Figure 1:
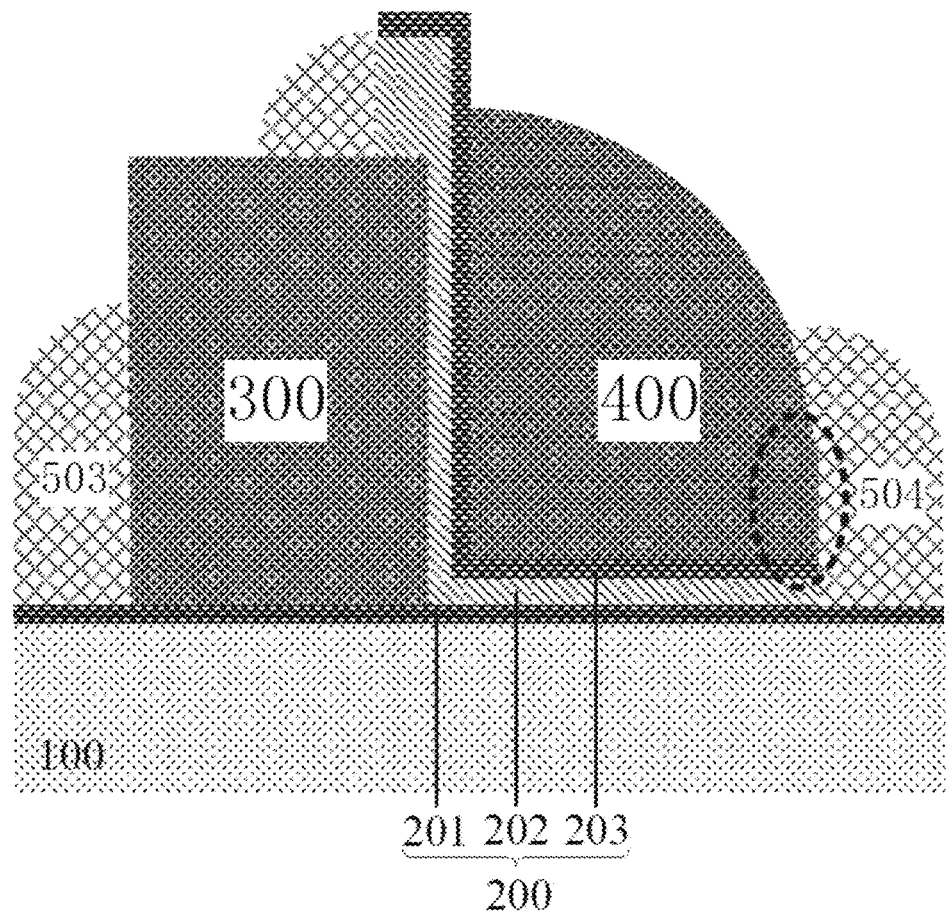
FIG. 1 illustrates a schematic structural diagram of a 1.5 T SONOS memory.
Figure 2A:
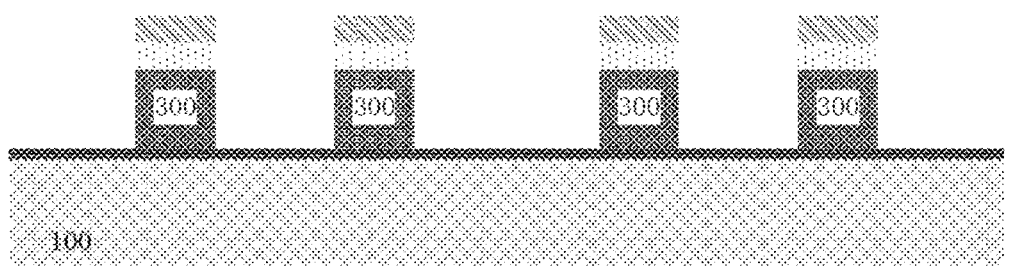
FIGS. 2A-2F illustrate schematic structural diagrams in a process of manufacturing a 1.5 T SONOS memory according to an existing process for manufacturing a 1.5 T SONOS memory.
Figure 2B:
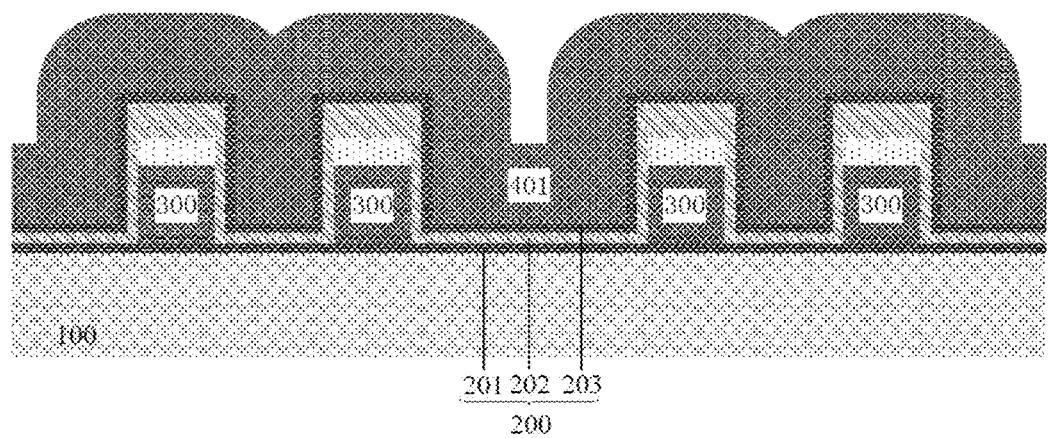
Figure 2C:
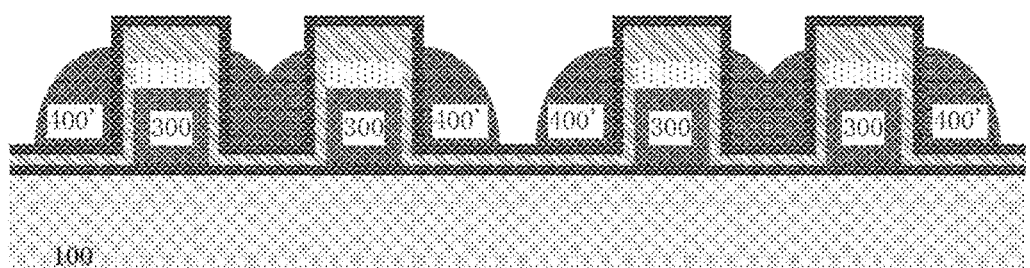
Figure 2D:
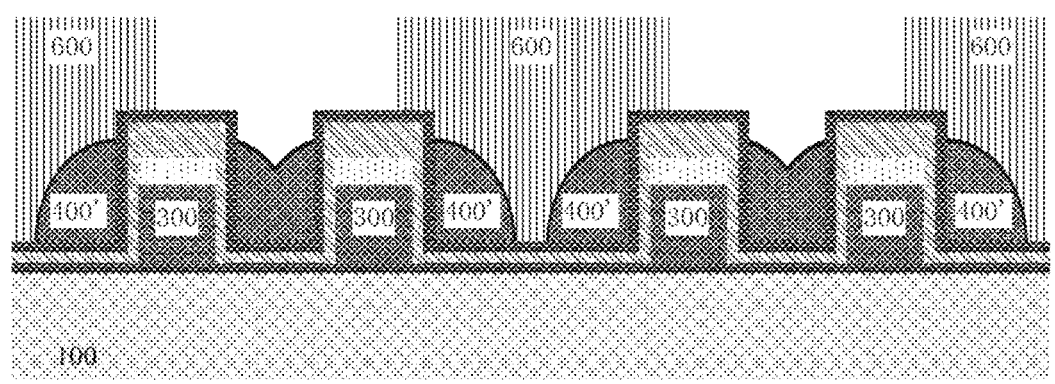
Figure 2E:
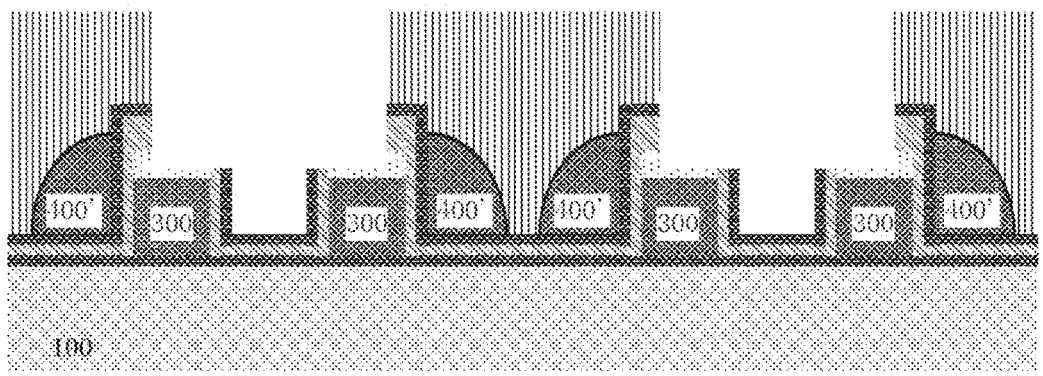
Figure 2F:
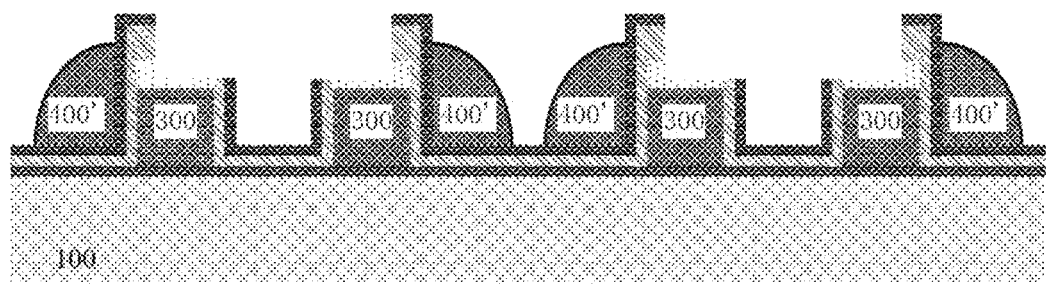
Figure 3:
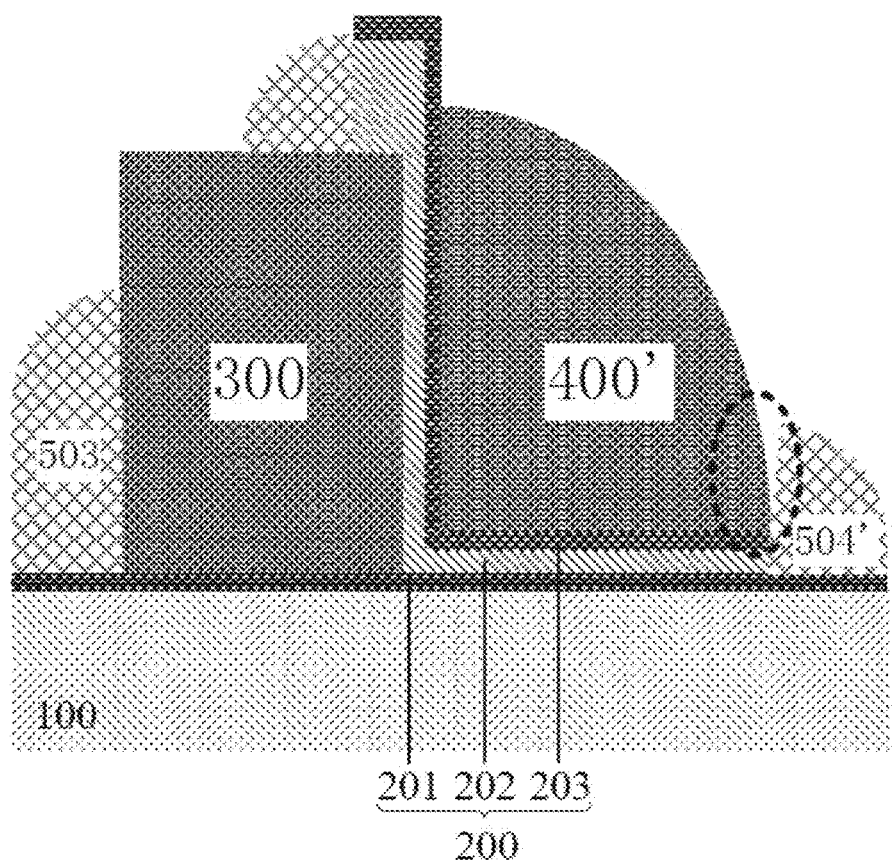
FIG. 3 illustrates a schematic structural diagram of the 1.5 T SONOS memory manufactured according to the existing process provided in FIGS. 2A-2F.

- 100 Substrate
- 200 ONO storage layer
- 201, 203 Oxide
- 202 Nitride
- 300 Selective transistor gate
- 400, 400' Storage transistor gate
- 401 Polysilicon layer
- 503 Selective transistor sidewall
- 504, 504' Storage transistor sidewall
- 600 Photoresist
- 700 Third layer
- 701 Barrier layer
- 800 Second layer

DETAILED DESCRIPTION OF THE DISCLOSURE

The present application relates to semiconductor technology and devices. More specifically, embodiments of the present application provide a method for manufacturing a SONOS memory. The edge of a storage transistor gate of a SONOS memory formed according to the manufacturing method provided by the embodiments of the present application has a vertical structure, so that the device performance can be improved. The present application also provides other embodiments.

The following description is provided to enable those skilled in the art to implement and use the present application and incorporate it into specific application contexts. Various modifications and various uses in different applications are apparent to those skilled in the art, and the general principles defined herein can be applied to a wide range of embodiments. Therefore, the present application is not limited to the embodiments provided herein, but should be granted the broadest scope consistent with the principles and novel features disclosed herein.

In the following detailed description, many specific details are set forth to provide a more thorough understanding of the present application. However, it is obvious to those skilled in the art that the practice of the present application may not necessarily be limited to these specific details. In other words, the well-known structures and devices are shown in block diagram forms and are not shown in detail, so as to avoid obscuring the present application.

Readers should be noted that all files and documents submitted with this specification and open to the public to consult this specification, and the contents of all of the files and documents are incorporated herein by reference. Unless otherwise stated directly, all the features disclosed in this specification (including any appended claims, abstract, and drawings) can be replaced by alternative features for achieving the same, equivalent, or similar purpose. Therefore, unless otherwise stated expressly, each feature disclosed is only an example of a set of equivalent or similar features.

It should be noted that when used, the left, right, front, rear, top, bottom, head, tail, clockwise, and counterclockwise signs are used for convenience only, and do not imply any specific direction. In fact, they are used to reflect the relative position and/or orientation between various parts of an object.

As used herein, the terms "over", "under", "between", and "on" refer to a relative position of one layer relative to another layer. Likewise, for example, a layer deposited or placed over or under another layer may directly contact the other layer or may be separated from the other layer by one or more intermediate layers. Moreover, a layer deposited or placed between layers may directly contact the layers or may be separated from the layers by one or more intermediate layers. In contrast, a first layer "on" a second layer is in contact with the second layer. In addition, a relative position of one layer relative to the other layers is provided (assuming that deposition, modification, and film removal operations are performed relative to a base substrate, regardless of the absolute orientation of the substrate).

As described above, no vertical structure is formed on the outer side of a storage transistor gate in the existing 1.5 T SONOS memory manufacturing process, and therefore, no effective sidewall can be formed subsequently, resulting in degradation of the performance of the 1.5 T SONOS memory. In order to solve the problem described above, one aspect of the present application provides a method for manufacturing a SONOS memory. FIG. 4 illustrates a schematic flowchart of the method for manufacturing a SONOS memory provided in one aspect of the present application.

Referring to FIG. 4, the manufacturing method provided in one aspect of the present application includes: step S100: a substrate is provided, wherein a first transistor gate of the SONOS memory and a first layer used for forming a second transistor gate are formed on the substrate, and the first layer covers the first transistor gate and the substrate; step S200: a patterned second layer is formed on the upper surface of the first layer, wherein the second layer exposes the first layer corresponding to the outer side of the second transistor gate; step S300: first etching is performed on the first layer exposed by the second layer; step S400: the second layer is removed to re-expose the first layer; and step S500: second etching is performed on the first layer to form the second transistor gate.

In the method for manufacturing a 1.5 T SONOS memory provided by the present application, the verticality of the edge of a storage transistor gate can be effectively improved by etching polysilicon that forms the storage transistor twice, providing the possibility for subsequently forming an effective sidewall on the outer side of the storage transistor gate, and thereby effectively improving the device performance.

Further reference is made to FIGS. 5A-5H to understand a technological process of the method for manufacturing a SONOS memory method provided in one aspect of the present application.

Figure 5B:
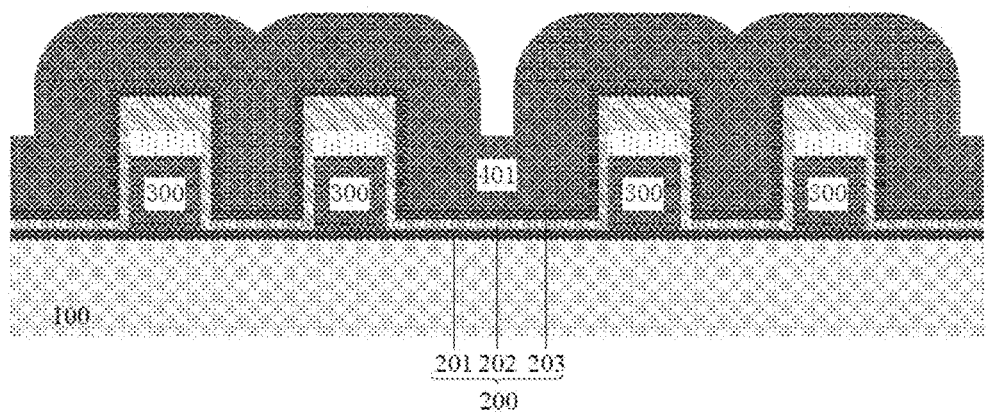
Figure 5C:
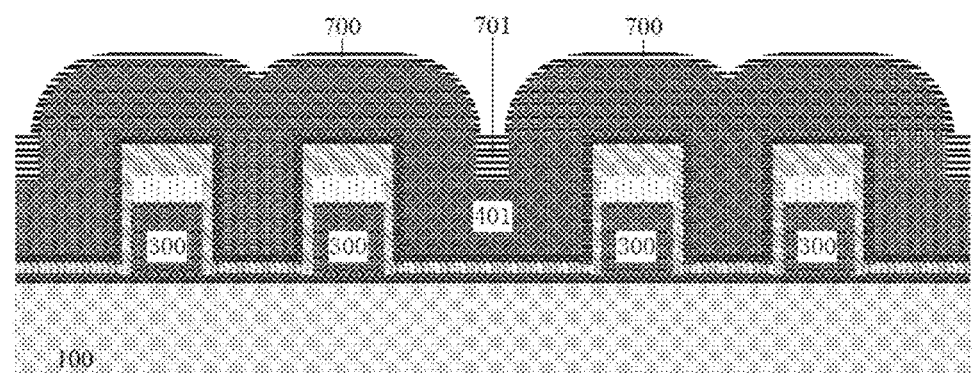
Figure 5D:
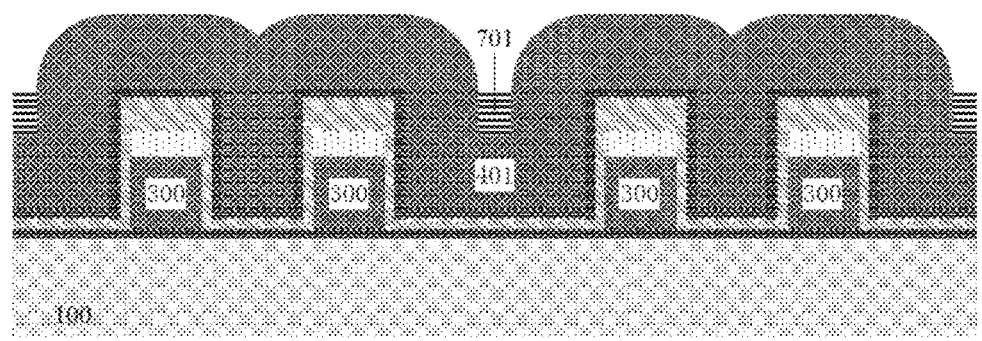

First, reference is made to FIGS. 5A and 5B to understand step S100. Referring to FIG. 5A, step S100 includes providing the substrate 100 and forming a selective transistor gate 300 over the substrate 100. The substrate 100 may be a semiconductor wafer such as a silicon wafer. Alternatively or additionally, the substrate 100 may include an elemental semiconductor material, a compound semiconductor material, and/or an alloy semiconductor material. Examples of the elemental semiconductor material may be, but are not limited to, crystalline silicon, polysilicon, amorphous silicon, germanium, and/or diamond. Examples of the compound semiconductor material may be, but are not limited to, silicon carbide, gallium arsenide, gallium phosphide, indium phosphide, indium arsenide, and/or indium antimonide. Examples of the alloy semiconductor material may be, but are not limited to, SiGe, GaAsP, AlInAs, AlGaAs, GaInAs, GaInP, and/or GaInAsP. The selective transistor gate 300 can be made of an existing or future gate material, including but not limited to polysilicon or metal tungsten. A gate dielectric layer is formed between the substrate 100 and the selective transistor gate 300. In an embodiment provided in one aspect of the present application, the gate dielectric layer is an oxide 201 in an ONO storage layer.

In the embodiment described above, the first transistor is a selective transistor, and the second transistor is a storage transistor. It can be understood that those skilled in the art could adjust the selective transistor and the storage transistor as needed. If the gate of the storage transistor is formed first, the gate dielectric layer between the substrate and the storage transistor gate is the ONO storage layer. It can be understood that various dielectric layers may be formed over the selective transistor gate 300 according to actual process needs, and the various dielectric layers over the selective transistor should not unduly limit the protection scope of the present application.

As shown in FIG. 5B, after the selective transistor gate 300 is formed, the ONO storage layer 200 covering the selective transistor gate 300 and the substrate is formed, and a polysilicon layer 401 used for forming the storage transistor gate is formed over the ONO storage layer 200. As described above, the ONO storage layer 200 further includes the oxide 201, a nitride 202, and an oxide 203. Those skilled in the art could form the ONO storage layer via a deposition process, and the deposition process includes, but is not limited to, chemical vapor deposition (CVD), physical vapor deposition (PVD), atomic layer deposition (ALD), high-density plasma CVD (HDPCVD), metal organic CVD (MOCVD), or plasma enhanced CVD (PECVD).

The ONO storage layer 200 also functions as an isolation wall between the selective transistor gate 300 and the subsequently formed storage transistor gate. It can be understood that if the order of forming the selective transistor and the storage transistor is adjusted to form the storage transistor gate first, an isolation dielectric layer of other materials can be formed before the first layer for forming the selective transistor gate is formed, wherein the isolation dielectric layer functions as an isolation wall between the selective transistor gate and the storage transistor gate.

Referring to FIGS. 5A and 5B, in an embodiment, a plurality of SONOS memories are formed on the substrate, and FIG. 5A illustrates selective transistor gates of a plurality of SONOS memories formed on the substrate. The polysilicon layer 401 that forms the storage transistor gate shown in FIG. 5B covers the selective transistor gates of the plurality of SONOS memories, and in a subsequent technological process, operations are performed synchronously on the plurality of SONOS memories to form a plurality of SONOS memories at the same time.

In the structure shown in FIGS. 5A and 5B, due to layout-related reasons, each two of the plurality of SONOS memories are configured as a group, and the two SONOS memories in the same group are arranged symmetrically, that is, relative positions between a selective transistor gate and a storage transistor gate of two adjacent SONOS memories are opposite to each other. Referring to FIG. 5B, FIG. 5B illustrates four SONOS memories, wherein a selective transistor gate of a leftmost SONOS memory is located on the right side of a storage transistor gate of the leftmost SONOS memory, and a selective transistor gate of a second SONOS memory from the left is on the left side of a storage transistor gate of the second SONOS memory from the left. In such the layout design, portions corresponding to the outer sides of the storage transistor gates in a group are side portions of the group of SONOS memories, i.e., an interface portion of the group of SONOS memories with respect to another group of SONOS memories.

Then, reference is made to FIGS. 5C-5F to understand step S200. In order to form the patterned second layer that exposes the polysilicon layer on the outer side of the storage transistor gate, first, referring to FIG. 5C, a third layer 700 covering the polysilicon layer 401 is formed. In an embodiment, the third layer 700 is made of silicon nitride. It can be seen from FIG. 5C that, since two SONOS memories are configured as a group and the two SONOS memories in the group are bilaterally symmetrical, a deep accumulation portion may be formed between one group of SONOS memories and another group of SONOS memories, and the portion corresponds to the outer side of the storage transistor gate. Therefore, referring to FIG. 5D, the third layer 700 is etched, and the relatively deep portion corresponding to the outer side of the storage transistor gate is retained as a barrier layer 701.

In embodiment described above, the third layer 700 that does not correspond to the outer side of the storage transistor gate can be removed by means of a dry etching process. It can be understood that those skilled in the art could remove the third layer 700 via an existing or future means, and a specific method for removing the third layer 700 should not unduly limit the protection scope of the present application.

Figure 5E:
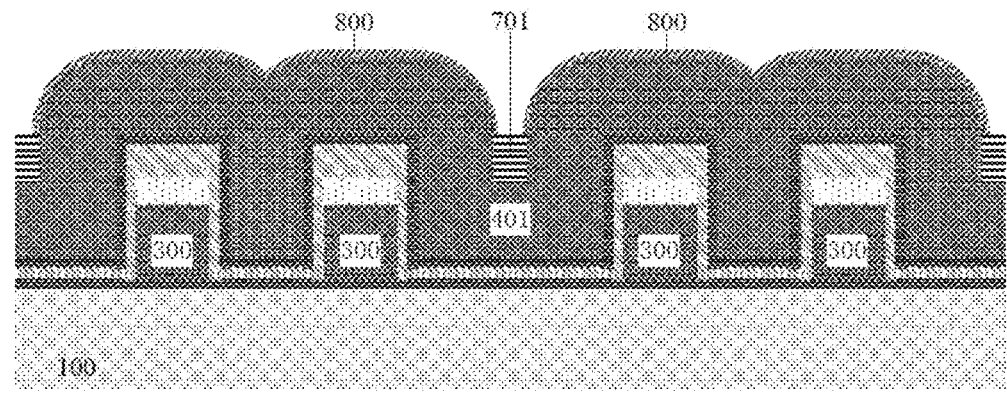
Figure 5F:
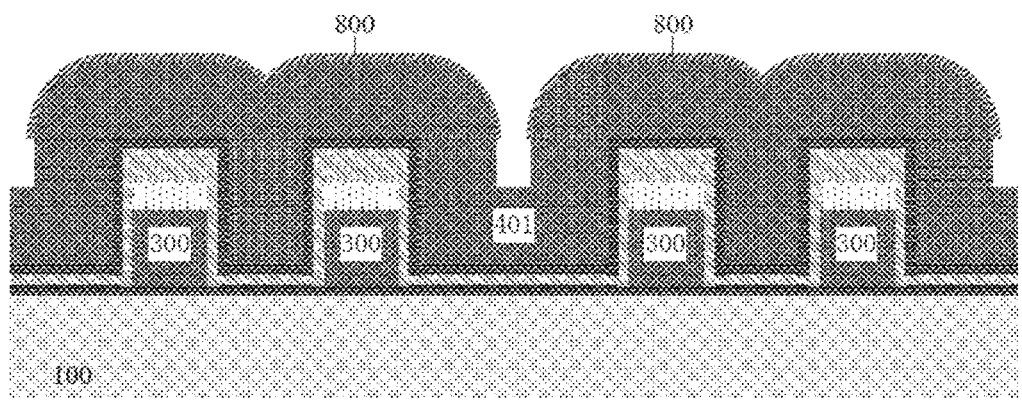

Referring to FIG. 5E, due to the existence of the barrier layer 701, the second layer 800 can be formed on the upper surface of the polysilicon layer 401 of the storage transistor gate where the barrier layer 701 is not formed. In an embodiment, the formed second layer 800 is an oxide. Further, forming the second layer 800 of the oxide includes: performing, by using the barrier layer 701 as a barrier, oxidization on an area of the polysilicon layer 401 where the barrier layer 701 is not formed, to form the second layer 800 made of silicon oxide.

In this way, the patterned second layer that exposes the outer side of the storage transistor gate is formed. Next, referring to FIG. 5F, the barrier layer 701 is removed. In an embodiment, the above-mentioned barrier layer 701 may be removed by wet etching, and the barrier layer 701 may be removed by a wet method with a high selectivity reagent. In an embodiment, the barrier layer 701 can be removed by means of wet etching, wherein the barrier layer 701 is removed by using a reagent with a high selection ratio in a wet manner. In an embodiment, the reagent with a high selection ratio is phosphoric acid. It can be understood that the barrier layer can also be removed by means of other processes, and a method for removing the barrier layer 701 should not unduly limit the protection scope of the present application. Since the barrier layer 701 is formed in the groove, it would be easier to remove the barrier layer 701 by means of wet cleaning.

Figure 5G:
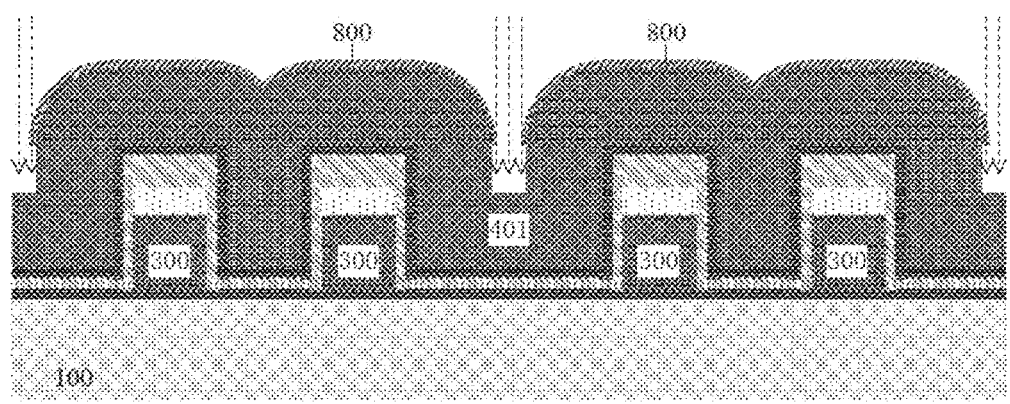

Reference is made to FIG. 5G to understand step S300. Referring to FIG. 5G, after the patterned second layer 800 that exposes the outer side of the storage transistor gate is formed, the second layer 800 is used as a mask layer to perform the first etching on the exposed outer side of the storage transistor gate. It can be understood that, since the first layer on the top of the selective transistor gate is blocked by the second layer, an etching rate of the first layer on the top of the selective transistor gate is much less than that of the first layer corresponding to the outer side of the storage transistor gate and not blocked by the second layer.

In an embodiment, the polysilicon layer 401 exposed by the second layer 800 is completely removed by the etching, thereby directly forming the outer side of the storage transistor gate with a vertical structure. In another embodiment, the polysilicon layer 401 exposed by the second layer 800 is not completely removed by the etching, but a half of the polysilicon layer 401 can be etched as needed. Even in the second embodiment of the manufacturing method provided by the present application, the vertical outer side of the storage transistor gate can be defined after the first etching, so that it can be ensured that the formed outer side of the storage transistor gate is vertical in the subsequent second etching.

Figure 5H:
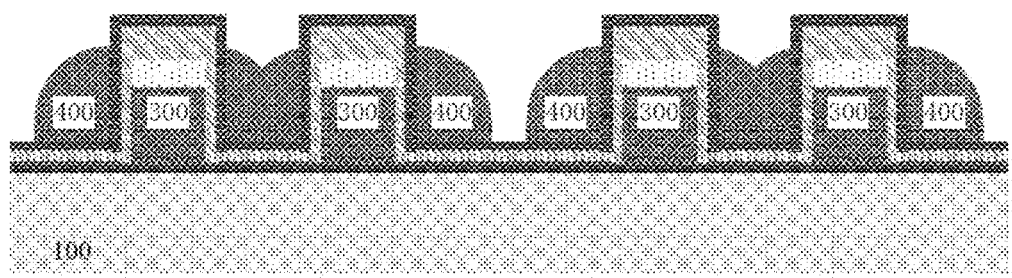

Reference is then made to FIG. 5H to understand step S400 and step S500. After the vertical outer side of the storage transistor gate is formed or defined, the second layer 800 used as the mask layer is etched and removed in step S400. Subsequently, in step S500, the second etching is performed on redundant polysilicon on the top of the selective transistor gate to remove the redundant polysilicon on the top of the selective transistor gate. It can be understood that, in the embodiment in which the polysilicon 401 exposed by the second layer 800 is not completely removed, the second etching further includes etching for removing the polysilicon not completely removed and corresponding to the outer side of the storage transistor gate. Finally, after the second etching, referring to FIG. 5H, the storage transistor gate 400 with the vertical outer side is formed, thereby providing a foundation for subsequent formation of an effective sidewall 504 shown in FIG. 1.

It can be understood that, in order to form a SONOS storage structure, on the basis of the structure shown in FIG. 5H, the redundant polysilicon between the selective transistor gates 300 needs to be moved, sidewalls 503 and 504 are respectively formed on the outer sides of the selective transistor gate 300 and the storage transistor gate 400, and other process steps required for implementing the performance of the SONOS memory are performed. Although not specifically described in the present application, it does not mean that these steps do not exist actually.

In addition, since the vertical structure is formed on the outer side of the storage transistor gate, the sidewall 504 subsequently formed on the outer side of the storage transistor gate may have a relatively large height, implementing relatively well coating performance on storage transistor gate 400, and thereby ensuring the performance of the SONOS memory.

It can be understood that, since there are a plurality of SONOS memories on the substrate, step S100 to step S500 are performed to synchronously process the plurality of SONOS memories, thereby improving the efficiency of the entire technological process.

So far, the method for manufacturing a SONOS memory provided in one aspect of the present application is described above. According to the method for manufacturing a SONOS memory provided in one aspect of the present application, the current 1.5 T SONOS memory manufacturing process can be improved to effectively overcome the problem of no vertical structure formed on the side of the storage transistor gate in the existing process and to form a vertical gate side structure via a simple process, so that an etching process for etching the storage transistor gate is easier to be controlled, thereby facilitating the improvement of memory cell performance and increasing a process control window.

Another aspect of the present application provides a SONOS memory formed according to the method for manufacturing a SONOS memory described above. Referring to FIG. 1, the verticality of the side of the storage transistor gate of the SONOS memory provided in another aspect of the present application is better, so that the device performance is more stable.

Therefore, the embodiments of the method for manufacturing the SONOS memory having a vertical structure on the edge of the storage transistor and the device structure formed thereby are described above. Although the present disclosure is described with respect to specific exemplary embodiments, it is obvious that various modifications and changes can be made to these embodiments without departing from the broader spirit and scope of the present disclosure. Therefore, the specification and drawings should be construed as being illustrative rather than restrictive.

It should be understood that this specification will not be used to interpret or limit the scope or meaning of the claims. In addition, in the foregoing detailed description, it can be seen that various features are combined together in a single embodiment for the purpose of simplifying the present disclosure. The method of the present disclosure should not be construed as reflecting that the claimed embodiments require more features than those explicitly listed in each claim. On the contrary, as reflected in the appended claims, the inventive subject matter includes features less than all the features of a single disclosed embodiment. Therefore, the appended claims are hereby incorporated into the detailed description, with each claim independently used as an independent embodiment.

An embodiment or embodiments mentioned in the description are intended to be included in at least one embodiment of a circuit or method in combination with the specific features, structures, or characteristics described in the embodiment. The phrase "an embodiment" in various portions of the specification does not necessarily refer to the same embodiment.

What is claimed is:

1. A method for manufacturing a SONOS memory, comprising steps of:
   providing a substrate, wherein a first transistor gate of the SONOS memory and a first layer used for forming a second transistor gate are formed on the substrate, and the first layer covers the first transistor gate and the substrate;
   forming a patterned second layer on an upper surface of the first layer, wherein the patterned second layer exposes the first layer corresponding to an outer side of the second transistor gate;
   performing first etching on the first layer exposed by the patterned second layer;
   removing the patterned second layer to re-expose the first layer; and
   performing second etching on the first layer to form the second transistor gate,
   wherein the forming the patterned second layer comprises:
      forming a barrier layer on the upper surface of the first layer corresponding to the outer side of the second transistor gate;

forming the patterned second layer on the upper surface of the first layer where the barrier layer is not formed; and removing the barrier layer, wherein the performing the first etching on the first layer exposed by the patterned second layer comprises:

partially etching the first layer exposed by the patterned second layer, to define a vertical outer side of the second transistor gate, and wherein the performing the second etching on the first layer comprises:

etching the first layer that is not etched in the first etching and is exposed by the patterned second layer, to form the vertical outer side of the second transistor gate.

2. The method for manufacturing the SONOS memory according to claim 1, wherein the forming the barrier layer comprises:

forming a third layer covering the first layer; and etching the third layer, and retaining the third layer corresponding to the outer side of the second transistor gate as the barrier layer.

3. The method for manufacturing the SONOS memory according to claim 1, wherein the barrier layer is silicon nitride, the first layer is polysilicon, and the forming the patterned second layer on the upper surface of the first layer where the barrier layer is not formed comprises:

performing, by using the barrier layer as a barrier, oxidation on an area of the first layer where the barrier layer is not formed, to form the patterned second layer made of silicon oxide.

4. The method for manufacturing the SONOS memory according to claim 3, wherein the removing the barrier layer comprises:

removing the barrier layer by using a reagent with a high selection ratio in a wet manner.

5. The method for manufacturing the SONOS memory according to claim 1, wherein the performing the first etching on the first layer exposed by the patterned second layer comprises:

completely etching the first layer exposed by the patterned second layer, to form the vertical outer side of the second transistor gate.

6. The method for manufacturing the SONOS memory according to claim 1, wherein an isolation layer is formed between the first transistor gate and the first layer, and the formed second transistor gate is adjacent to the first transistor gate via the isolation layer.

7. The method for manufacturing the SONOS memory according to claim 1, wherein first transistor gates of a plurality of SONOS memories are formed on the substrate, the first layer covers a plurality of first transistor gates, and the patterned second layer exposes the first layer corresponding to outer sides of a plurality of second transistor gates; and wherein the performing the first etching on the first layer and the performing the second etching on the first layer comprises:

synchronously forming the plurality of second transistor gates.

8. The method for manufacturing the SONOS memory according to claim 7, wherein first transistor gates and second transistor gates of two adjacent SONOS memories are arranged symmetrically.

9. The method for manufacturing the SONOS memory according to claim 1, wherein the method further comprises:

forming a sidewall on an outer side of the first transistor gate and on the outer side of the second transistor gate.

10. The method for manufacturing the SONOS memory according to claim 1, wherein the first transistor gate is a storage transistor gate, and the second transistor gate is a selective transistor gate; or the first transistor gate is the selective transistor gate, and the second transistor gate is the storage transistor gate.

11. A SONOS memory, wherein the SONOS memory is formed by the method for manufacturing the SONOS memory according to claim 1.

* * * * *